(12) United States Patent
Loibl et al.

(10) Patent No.: US 6,193,564 B1
(45) Date of Patent: Feb. 27, 2001

(54) ELECTRIC CONNECTING CONFIGURATION

(75) Inventors: Josef Loibl, Regen; Ulf Scheuerer, Regensburg, both of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/294,705

(22) Filed: Apr. 19, 1999

(30) Foreign Application Priority Data

Apr. 17, 1998 (DE) .............................................. 198 17 198

(51) Int. Cl.⁷ .................................................. H01R 13/405
(52) U.S. Cl. .............................................................. 439/736
(58) Field of Search .................................. 439/736, 76.1, 439/29; 361/813, 622, 796

(56) References Cited

U.S. PATENT DOCUMENTS 5,386,337 * 1/1995 Schoettl ................................ 361/622

FOREIGN PATENT DOCUMENTS

| 44 29 983 C1 | 11/1995 | (DE) . |
|---|---|---|
| 195 03 778 A1 | 8/1996 | (DE) . |
| 195 41 925 A1 | 5/1997 | (DE) . |
| 93 21 190 U1 | 2/1998 | (DE) . |
| 197 12 842 Z1 | 8/1998 | (DE) . |

* cited by examiner

*Primary Examiner*—Paula Bradley
*Assistant Examiner*—Antoine Ngandjui
(74) *Attorney, Agent, or Firm*—Herbert L. Lerner; Laurence A. Greenberg; Werner H. Stemer

(57) ABSTRACT

A housing element includes a plurality of electric conductors which are guided in its interior and which can be connected electrically at first conductor ends to an electronic circuit provided in the housing. Second conductor ends of the electric conductors protrude from the housing element. There, a plug-in connector body is disposed which surrounds the second conductor ends in the manner of a plug housing, and the second conductor ends form electric contact pins of the plugin connector body.

15 Claims, 4 Drawing Sheets

ELECTRIC CONNECTING CONFIGURATION

BACKGROUND OF THE INVENTION

Field of the Invention

The invention relates to a configuration for electrically connecting an electronic circuit, which can be held in an assembly housing, in particular in a transmission case or engine control unit housing, to an electric periphery provided outside the assembly housing.

German Patent 197 12 842 C1 describes a gear control unit which is provided for installation in an automatic transmission. The housing of the gear control unit includes a plastic housing cover, in which electric conductors are encapsulated and led to the gear control circuit disposed in the housing. In this case, the electric contact between the conductors running in the cover and an external electric periphery is made via an oil-tight gear plug. The gear plug implements electric penetration of the gearbox, the conductors running in the housing cover of the gear control unit being connected to the corresponding electric contacts of the plug via riveted or soldered connections.

SUMMARY OF THE INVENTION:

It is accordingly an object of the invention to provide an electric connecting configuration that overcomes the above-mentioned disadvantages of the prior art devices of this general type, which is of simple construction and has a cost effective configuration that permits reliable electric connection of an electronic circuit held in an assembly housing to an external electric periphery.

With the foregoing and other objects in view there is provided, in accordance with the invention, in combination with a circuit carrier having an electronic circuit disposed thereon, a housing surrounding the circuit carrier, including: a base element holding the circuit carrier with the electronic circuit; a plastic housing cover coupled to the base element; electric conductors having first and second conductor ends embedded in the plastic housing cover, the first conductor ends to be connected electrically to the electronic circuit, and the second conductor ends protruding outward from the plastic housing cover for connecting to an external periphery;

and a plug-in connector body disposed on the plastic housing cover and surrounding the second conductor ends in a manner of a plug housing and having protruding electric contact pins formed from the second conductor ends.

By making use according to the invention of the second conductor ends, protruding from the basic element, as pin contacts of the plug-in connector body, the previously required fabrication step of soldering or riveting the conductor ends to the electric contacts of the plug can be eliminated. The cost of producing the basic element is reduced by eliminating this fabrication step. A further reduction in cost is yielded by material saving, because instead of a complete stand-alone gear plug, use is now made of a simple plug-in connector body without dedicated electric contact elements.

A further advantage of the invention consists in that a marked increase in reliability is achieved by avoiding connecting points in the electric conducting paths. This becomes advantageously noticeable particularly in the case of applications in the automotive field, because the risk of loosening of electric connecting points which always exists given the high vibrations occurring there is ruled out by the continuous conductor guidance according to the invention.

The basic element is preferably fabricated as a plastic injection-molded part, since in this case the conductors can be embedded in the basic element in a simple way by encapsulating the conductors.

A preferred refinement of the invention is characterized in that the protruding second conductor ends have a surface structure, in particular an embossed structure, and/or are coated with a metal, in particular tin or silver. As a result, there is an increase in the ability of the second conductor ends to make good electric contact, it being the case, furthermore, that a metal coating makes it easier for the second conductor ends to slide into the corresponding contact holders of a mating connector.

A further expedient measure consists in that the second conductor ends have a reduced outside diameter by comparison with the conductors guided in the interior of the basic element. The reduction in the conductor end diameter is achieved by a material-removing form of machining, which permits the plug-in connector body according to the invention with the protruding second conductor ends still to be rendered compatible with a prescribed mating connector after the injection operation.

In a first embodiment, the plug-in connector body is constructed in an integral fashion with the basic element. In this case, the entire connecting configuration according to the invention can be constructed in a single fabrication step (plastic injection step). When the configuration according to the invention is used in a gear, a further advantage of the embodiment consists in that the electric plug contacts formed by the second conductor ends are sealed off from oil in a simple way, if appropriate in combination with a particular shaping of the conductor laid in the basic element. All that is then required is to take suitable measures to seal the plug-in connector body externally upon insertion into a through opening in a gearbox wall.

In the first embodiment, it is possible, furthermore, to provide a transition region of increased flexibility on the plug-in connector body, it being possible even in the case of a slightly varying installation position or problems of dimensional stability always to achieve a satisfactory fit between the plug-in connector body and a through opening provided in the gearbox.

A second embodiment is characterized in that the plug-in connector body is a separate flexible plastic molding provided with through bores for the second conductor ends. After the production of the basic element, the plastic molding is simply pressed onto the protruding second conductor ends. The possibility provided here of freely selecting material and shaping the separate plastics molding renders it possible to configure the flexibility of the latter at will. The second embodiment yields advantages when a particular flexible plug-in connector body is required because of fitting difficulties.

In the second embodiment, it is expedient for the second conductor ends in the region of the through bores of the plastics molding to be provided with a surface structure in the shape of fir cones or scales, because it is thereby possible to achieve an increased tightness of the plug-in connector body with respect to oil in the region of the conductor bushings.

The first conductor ends also preferably protrude from the basic element in a bearing region for the assembly housing, and make contact there with conductor tracks of a flexible conductor track carrier which makes contact with the electronic circuit. In this case, all electric contact points in the incoming region between the external electric periphery and the flexible conductor track carrier are implemented as plug-in connections.

In a preferred embodiment, the plug-in connector body has at least one bending zone in which the electric conductors are guided essentially in a plane. The plug-in connector body is constructed to be thin or slim in the bending zone, with the result that the plug-in connector can move to a certain extent in the bending zone. This markedly facilitates the mounting of the configuration in a gearbox.

Other features which are considered as characteristic for the invention are set forth in the appended claims.

Although the invention is illustrated and described herein as embodied in an electric connecting configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
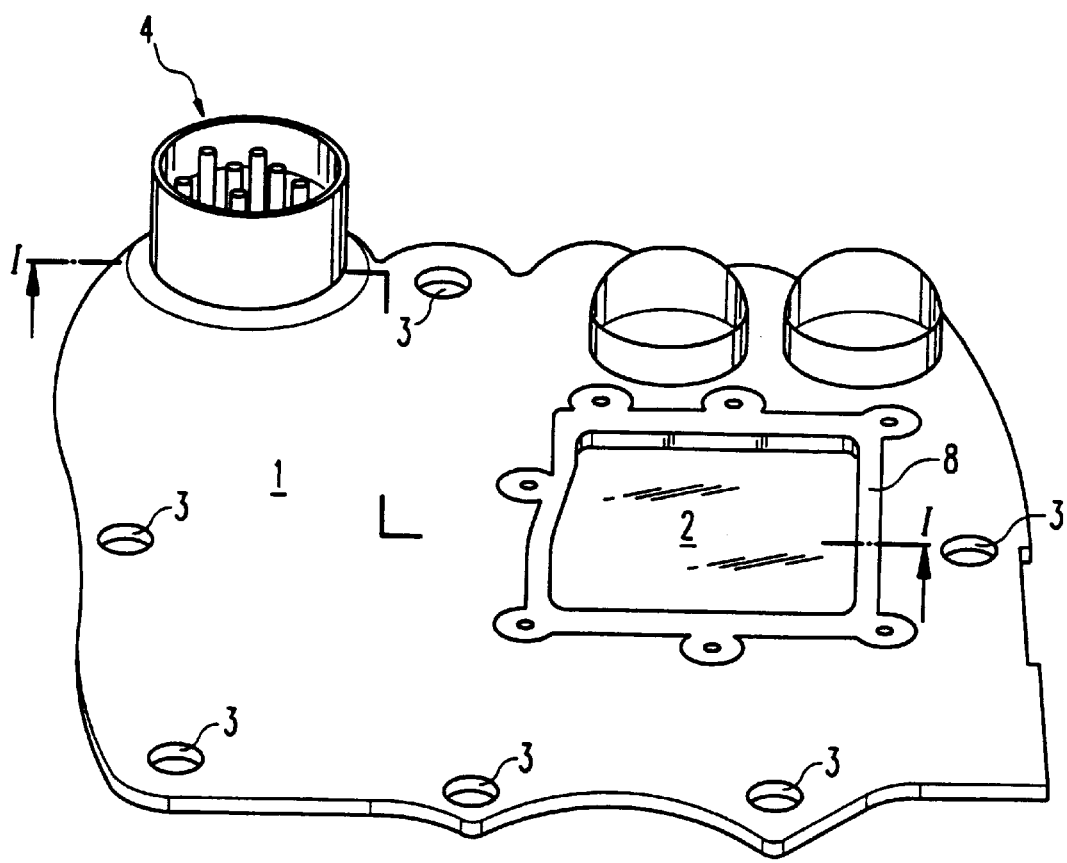
FIG. 1 is a diagrammatic perspective view of a basic element with an integral plug-in connector body according to the invention.

In all the figures of the drawing, sub-features and integral parts that correspond to one another bear the same reference symbol in each case. Referring now to the figures of the drawing in detail and first, particularly, to FIG. 1 thereof, there is shown a planar plastic element 1 which includes an integrally constructed housing cover 2 of a gear control unit which is not represented in more detail in FIG. 1. The plastic element 1 serves as a carrier body of the gear control unit, and has bores 3 via which it can be fastened to a non-illustrated hydraulic control plate of a gear. In addition to the trough-shaped housing cover 2 having a circumferential bearing surface 8, the plastic element 1 has a gear plug 4 which projects in the installed state through an opening in a gearbox wall and can be coupled there mechanically to a mating connector of complementary construction. The gear plug 4 serves the purpose of electrically connecting to an external periphery the gear control unit and, if appropriate, further electric components, such as sensors, actuators and the like which are mounted on the plastic element 1.

Figure 2:
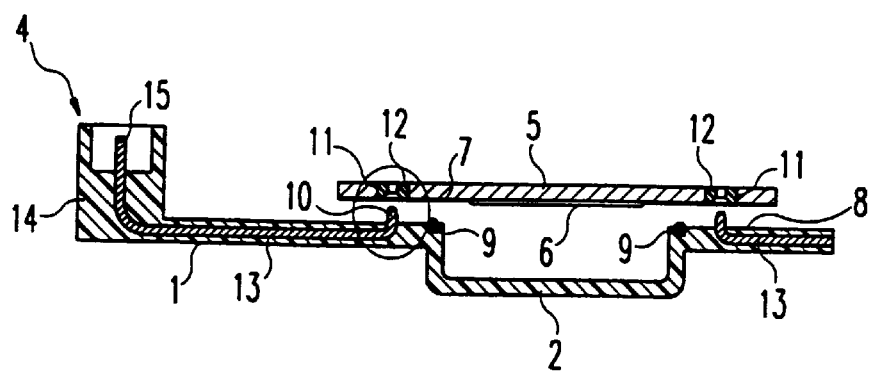
FIG. 2 is a sectional view taken along the line I—I shown in FIG. 1.

FIG. 2 shows a cross section through the plastic element 1 along the line I—I in FIG. 1. A metallic base plate 5 is represented above the housing cover 2. The housing cover 2 and the base plate 5 form a housing 2, 5 of the gear control unit. Located inside the housing 2, 5 is an electronic circuit 6 which can also be applied (in a way not represented) to an elevation of the base plate 5. The circuit 6 is implemented by a ceramic substrate fitted with electronic components. The circuit 6 is surrounded by a conductor track carrier which is constructed as a flexible polyimide film 7 and is laminated or bonded onto the base plate 5 and makes contact with the electronic circuit 6 in the interior of the housing 2, 5. Provided in a radially inner region of the bearing surface 8 is a circumferential seal 9 against which the base plate 5 bears in the mounted state, and which serves to seal off the interior of the housing 2, 5 from gear oil.

In its edge region, the metallic base plate 5 has bores 11 into which insulating sleeves 12 constructed as press-fit bushes are introduced. As is still to be described in conjunction with FIGS. 5, 6a and 6b, metallized tabs of the polyimide film 7 which are in electric contact with conductor tracks extend to the insulating sleeves 12 and make contact there with first conductor ends 10 of electric conductor wires 13 which are embedded in the interior of the plastic element 1 and extend, as shown in FIG. 2, from the gear plug 4 up to the bearing region 8 of the housing cover 2.

In the example shown here, the gear plug 4 includes a plug-in connector body 14 that is of integral construction with the plastic element 1. The electric contacts of the gear plug 4 are implemented according to the invention by second conductor ends 15 of the conductor wires 13 running in the plastic element 1. In this way, the assembly composed of the gear plug 4 (that is to say the plug-in connector body 14 and the second conductor ends 15) and the plastic element 1 can be produced in one fabrication step, and no sealing problems can occur in the region between the second conductor ends 15 and the plug-in connector body 14.

Figure 3:
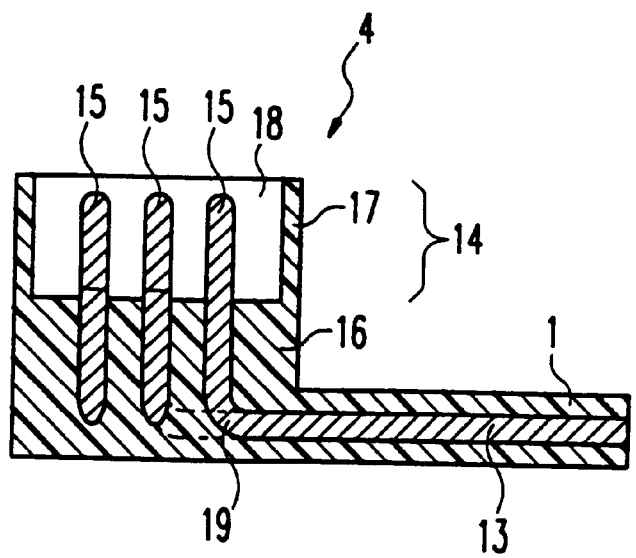
FIG. 3 is a sectional view of an enlarged representation of the plug-in connector body shown in FIG. 2, as well as a conductor guidance.
Figure 4:
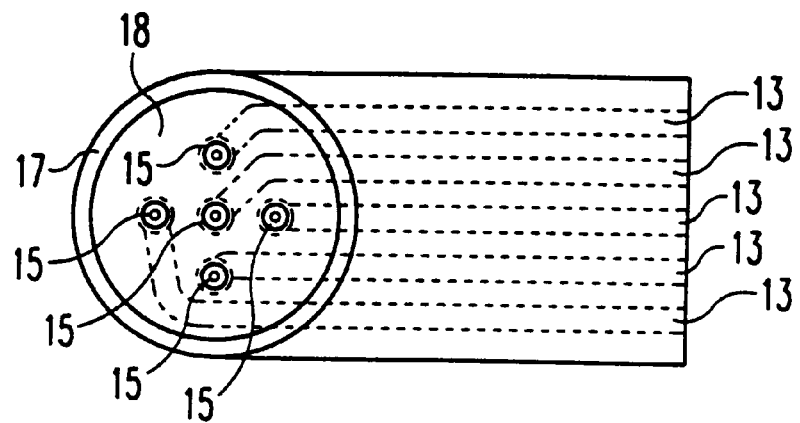
FIG. 4 is a top plan view of the representation shown in FIG. 3.

FIGS. 3 and 4 show the gear plug 4 according to the invention in an enlarged representation. The plug-in connector body 14 has a base region 16, which borders the plastic element 1 and is of integral construction therewith, and a housing extension 17 that extends from the base region at the circumference. The base region 16 and the housing extension 17 can be cylindrical and be provided in the circumferential region with a sealing mechanism such as, for example, O-rings or the like. Furthermore, the base region 16 can be configured by suitable shaping as a transition region of increased flexibility. Located inside the housing extension 17 is an interior 18 into which the second conductor ends 15 project and form electric contact pins. The second conductor ends 15 are connected here via 90° bends 19 to the conductor wires 13 running in the plastic element 1. It is also possible for the second conductor ends 15 to be made to emerge in a way not represented from the end face of the plastic element 1 in a direction parallel to the plane thereof.

FIG. 4 shows the course of the conductor wires 13 in a plan view. Since the conductor wires 13 preferably run in a plane, they are guided in the region of the plug-in connector body 14 such that no overlaps occur in the plane. The conductor wires 13 can be disposed parallel to one another, for example, outside the plug region.

When producing the plastic element 1, the electric conductor wires 13 are either laid directly in an injection mold, or they are fixed in their relative position with regard to one another in advance, for example, by having plastics webs injected onto them, and are subsequently encapsulated in the injection mold. This minimizes the cost of production, since the carrier body present in any case in an automatic transmission is now rendered usable simultaneously as the housing cover, conductor carrier and gear plug by the structural measures named above, with the result that all that is required later to finish the entire module is still to attach the metallic base plate 5 with the electronic circuit 6 disposed thereon. In this case, the base plate 5 simultaneously serves as a heat sink for the electronic circuit 6.

Figure 5:
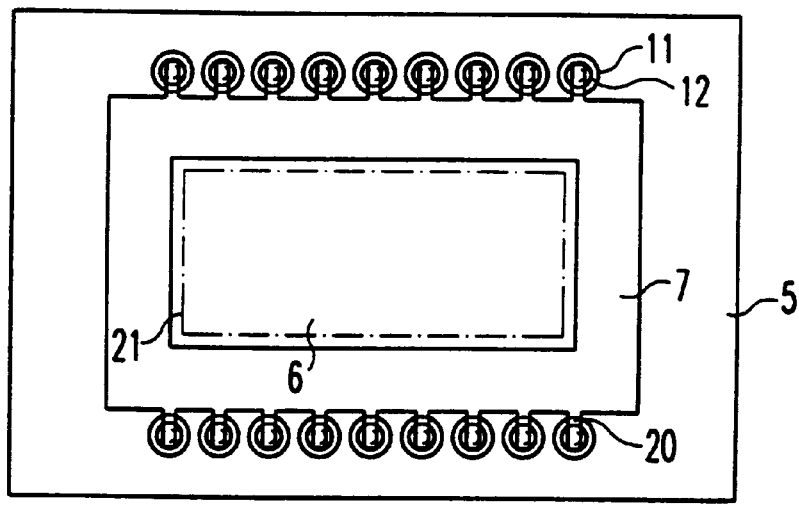
FIG. 5 is a plan view of a base plate of a control unit housing with a flexible conductor track film resting on it.
Figure 6A:
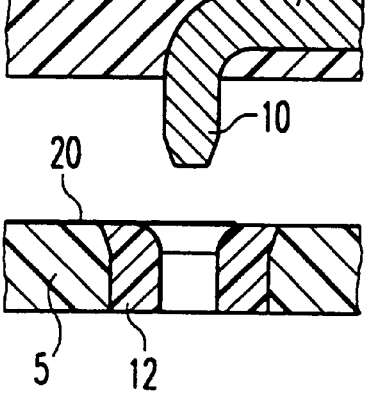
FIG. 6a is an exploded, sectional view of a first conductor wire end, protruding from a housing cover, before being inserted into an insulating bushing in the base plate.
Figure 6B:
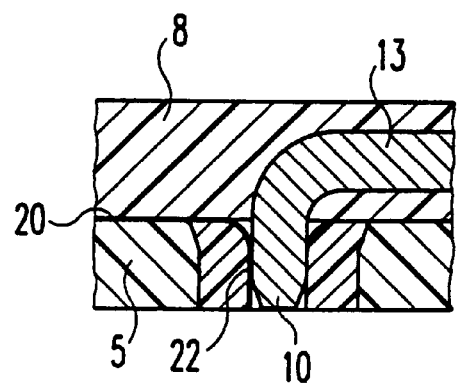
FIG. 6b is a sectional view of the first conductor wire end after insertion into the insulating bushing.

FIGS. 5, 6a and 6b show the electric contact of the electronic circuit 6 of the gear control unit in the region of the housing cover 2.

According to FIG. 5, the electronic circuit 6 is surrounded on all sides by the flexible polyimide film 7. A broken line indicates the contour 21 of an elevation of the base plate 5 that is bordered by the polyimide film 7. In an overlapping zone, the ceramic circuit carrier carrying the electronic circuit 6 projects beyond the elevation and is made to adhere, with the aid of an electrically conducting adhesive to the film 7, or is bonded thereon, thus producing an electric connection between the conductor tracks (not represented in FIG. 5) of the flexible film 7 and the electronic circuit 6.

The conductor tracks of the flexible film 7 are guided to the bores 11 and brought into contact therewith tabs 20, provided with metallic contact surfaces, of the flexible film 7, which are disposed above the bores 11.

When the base plate 5 is fastened on the housing cover 2, the protruding first conductor ends 10 penetrate into the insulating sleeves 12 located in the bores 11, and in so doing make electric contact with the tabs 20 of the flexible polyimide film 7.

FIG. 6a shows the construction of the bearing region 8 of the housing cover 2 and the base plate 5 in the region (circled in FIG. 2) of the protruding first electric conductor end 10 before assembly. The insulating sleeve 12 is covered by the metallic tab 20, which is in electric contact with a conductor track of the flexible polyimide film 7.

The insulating sleeve 12 is made from an elastic, oil-resistant plastic material and has in its insertion region an under cut which corresponds to a widening in the upper region of the bore 11. The widening serves to stabilize the insulating sleeve 12 and further determines the mounting position of the insulating sleeve 12 in the base plate 5.

When the first conductor end 10 is pressed in, the tab 20 is drawn into the insulating sleeve 12. This produces a reliable electric and mechanically sufficient firm connection that is also able to cope with the environmental demands in a gear with regard to oil, vibration and temperature change.

In FIG. 6b, the first conductor end 10 is plugged into the insulating sleeve 12, the tab 20 being clamped (in a way which cannot be discerned) between the outer circumference of the first conductor end 10 and the inner circumference 22 of the sleeve 12. This clamping effects the electric connection.

Figure 7:
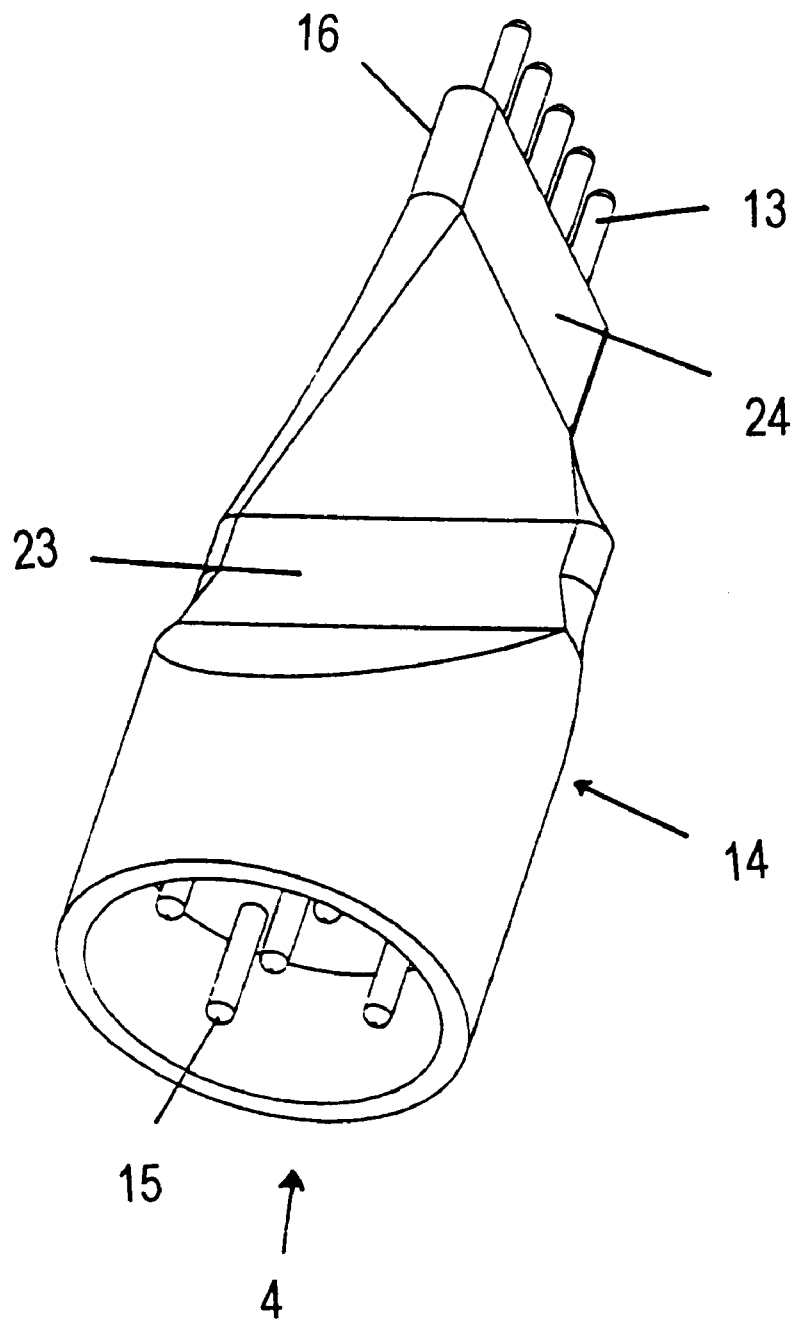
FIG. 7 is a perspective view of a plug body with two bending zones.

FIG. 7 illustrates a first bending zone 23 and a second bending zone 24 of the plug-in connector body 14 of the gear plug 4. The bending zones 23, 24 are mutually rotated at right angles. In the bending zone, all the conductor wires 13 are respectively aligned in a plane. The conductor wires 13 have twists in a region between the two bending zones 23, 24.

The conductor wires 13 are located in the region which is represented as free from a sheath, in reality inside the plastics element 1 which is represented in FIGS. 1 to 3. The base region 16 in which the bending zone 24 is located is therefore constructed in one piece with the plastic element 1.

The bending zones 23, 24 are of thin construction and provided with a relatively thin layer of plastic, with the result that the plug-in connector body can be bent in the plane in which the conductor wires 13 are disposed.

Flexible properties of the plug-in connector body in the x-direction and y-direction result from the configuration of the mutually rotated bending zones 23, 24. Consequently, when being installed in a gearbox of an automatic vehicle transmission, the plug-in connector body can easily be brought into the plug opening provided for the purpose.

The gear plug 4 can be aligned both parallel to the plastic element 1 and perpendicular or inclined thereto.

We claim:

1. In combination with a circuit carrier having an electronic circuit disposed thereon, a housing surrounding the circuit carrier, comprising:

a base element holding the circuit carrier with the electronic circuit;

a plastic housing cover coupled to said base element;

electric conductors having first and second conductor ends embedded in said plastic housing cover, said first conductor ends to be connected electrically to the electronic circuit, said second conductor ends protruding outward from said plastic housing cover for connecting to an external periphery; and a plug-in connector body disposed on said plastic housing cover and surrounding said second conductor ends in a manner of a plug housing and having protruding electric contact pins formed from said second conductor ends.

2. The housing according to claim 1, wherein said base element and said plastic housing cover formed one of a transmission case and an engine control unit housing.

3. The housing according to claim 1, wherein said plastic housing cover is a plastic injection-molded part.

4. The housing according to claim 1, wherein said second conductor ends have an embossed surface structure.

5. The housing according to claim 1, wherein said second conductor ends have a metallic coated embossed surface structure.

6. The housing according to claim 1, wherein said electrical conductors have main body members embedded in said plastic housing cover and said second conductor ends have a reduced outside diameter by comparison with said main body members embedded in said interior of said plastic housing cover.

7. The housing according to claim 1, wherein said first conductor ends protrude from said plastic housing cover and can be brought into electrical contact there with conductor tracks of a flexible conductor track carrier making contact with the electronic circuit.

8. The housing according to claim 1, wherein said second conductor ends have a metallic coated surface structure.

9. The housing according to claim 8, wherein said metallic coated surface structure is formed of a material selected from the group consisting of tin and silver.

10. The housing according to claim 1, wherein said plug-in connector body is constructed integral with said plastic housing cover.

11. The housing according to claim 10, wherein said plug-in connector body has a transition region bordering said plastic housing cover and is of increased flexibility in comparison with said plastic housing cover.

12. The housing according to claim 1, wherein said plug-in connector body is a separate flexible plastic molding having through bores formed therein for receiving said second conductor ends.

13. The housing according to claim 12, wherein said second conductor ends are provided in a region of said through bores with a surface structure in a shape of one of fir cones and scales.

14. The housing according to claim 1, wherein said plug-in connector body has a bending zone and said electric conductors are aligned along said bending zone substantially in a plane, and said plug-in connector body is thinner in said bending zone.

15. The housing according to claim 16, wherein said plug-in conductor body has a further bending zone and said electric conductors are aligned along said further bending zone substantially in a further plane which is substantially perpendicular to the plane of said bending zone.

* * * * *